(12) United States Patent
Ilchmann et al.

(10) Patent No.: US 6,791,377 B2
(45) Date of Patent: Sep. 14, 2004

(54) LVDS DRIVER IN BIPOLAR AND MOS TECHNOLOGY

(75) Inventors: Frank Ilchmann, Berlin (DE); Detlef Rösener, Berlin (DE); Ralph Ballentin, Birkenwerder (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/435,389

(22) Filed: May 12, 2003

(65) Prior Publication Data

US 2003/0227303 A1 Dec. 11, 2003

(30) Foreign Application Priority Data

Jun. 7, 2002 (EP) .............................................. 02360166

(51) Int. Cl.$^7$ .............................. H03B 1/00; H03B 3/00
(52) U.S. Cl. ........................ 327/108; 326/83; 326/84; 330/254
(58) Field of Search .............................. 327/108, 109, 327/112; 326/82, 83, 84; 330/252, 254

(56) References Cited

U.S. PATENT DOCUMENTS

| | | | |
|---|---|---|---|
| 4,471,320 A | | 9/1984 | Frey ............................ 330/254 |
| 4,999,519 A | * | 3/1991 | Kitsukawa et al. ........... 326/110 |
| 5,151,625 A | * | 9/1992 | Zarabadi et al. .............. 327/103 |
| 5,418,497 A | * | 5/1995 | Martin ........................... 331/48 |
| 6,040,731 A | | 3/2000 | Chen et al. ................... 327/359 |
| 6,111,431 A | | 8/2000 | Estrada ......................... 326/83 |

FOREIGN PATENT DOCUMENTS

| | | |
|---|---|---|
| DE | 199 22 354 A1 | 5/2000 |
| EP | 0 831 480 A1 | 3/1998 |

OTHER PUBLICATIONS

Vreede De L C N et al: "A high Gain Silicon AGC Amplifier with a 3 DB Bandwidth of 4 GHZ" IEEE Transactions on Microwave Theory and Techniques, IEEE Inc. New York, US<Bd. 42, Nr. 4, Part 1, Apr. 1, 1994, pp. 546–551, XP00044244.

Rein H–M et al: "Design Considerations for Very–High–Speed SI–Bipolar IC'S Operating up to 50 GB/S" IEEE Journal of Solid–State Circuits, IEEE, Inc. New York, US, Bd. 31, Nr. 8, Aug. 1, 1996, pp. 1076–1090, XP000623557.

* cited by examiner

*Primary Examiner*—Tuan T. Lam
(74) *Attorney, Agent, or Firm*—Sughrue Mion, PLLC

(57) ABSTRACT

A circuit arrangement for an LVDS driver, which uses combined bipolar and MOSFET technology with at least two MOSFETs, is shown, wherein a multiplier circuit is connected to an output stage of the LVDS driver and the multiplier circuit is controlled by means of an automatic control circuit, which generates control signals for controlling a current source of the multiplier circuit and for controlling the amplification factor of differential input signals of the multiplier circuit. Advantages of the invention are that it enables said technology, in which semi-conductor components are used in bipolar techniques (e.g. NPN and/or PNP transistors) (as well as MOS technology), to take advantage of the high speed of the bipolar elements compared with MOS elements.

8 Claims, 3 Drawing Sheets

LVDS DRIVER IN BIPOLAR AND MOS TECHNOLOGY

BACKGROUND OF THE INVENTION

The invention is based on a priority application EP 02360166.9 which is hereby incorporated by reference. The invention relates to a circuit arrangement for an LVDS driver (LVDS=Low Voltage Differential Signal) which uses combined bipolar and MOSFET technology with at least two MOSFETs.

LVDS drivers (LVDS=Low Voltage Differential Signal) are used for the transfer of data on symmetrical lines.

An LVDS driver in CMOS technology is known from DE 199 22 354 A1. Its speed is regarded, for speeds which will soon be required of approximately 1 Gbit/s, as too low. Moreover, the known arrangement needs a positive supply voltage of 2.5 volts or higher and this voltage is far higher than the output voltage level of 1.2 volts provided in the standard specification for LVDS drivers. Because of the high operational voltage a higher power loss results. The known circuit also needs a simulation arrangement for automatic control purposes.

SUMMARY OF THE INVENTION

The object of the invention is to cite an LVDS driver circuit in integrated semi-conductor technology, which enables an increase in the data rate compared with the prior art.

This object is achieved according to the invention in that a multiplier circuit is connected to an output stage of the LVDS driver and the multiplier circuit is controlled by means of an automatic control circuit, which generates control signals for controlling a current source of the multiplier circuit and for controlling the amplification factor of differential input signals of the multiplier circuit.

Advantages of the invention are that it enables said technology, in which semi-conductor components are used in bipolar techniques (e.g. NPN and/or PNP transistors) (as well as MOS technology), to take advantage of the high speed of the bipolar elements in comparison to MOS elements, if, as provided in the embodiment example, those parts of the LVDS driver which require high circuit speeds are carried out in bipolar techniques. MOS techniques are used, on the other hand, where this is advantageous for reasons of a high input resistance. Advantageously MOSFETs of equal polarity can be provided in embodiments of the invention.

It can be advantageous according to one embodiment of the invention to provide MOSFETs of different polarity (in other words at least one N channel MOSFET and at least one P channel MOSFET). The integrated circuit produced using MOSFETs of this kind together with bipolar elements is a case of BICMOS technology. This too has the advantages mentioned of high speed of the bipolar elements and the possibility created by the MOSFETs of low-power drive.

In embodiments only a small voltage of approximately 1.8 volts is required for the LVDS driver as positive supply voltage, taking into account the above-mentioned output voltage level. In order to be able to use components of the circuit arrangement which need a higher voltage or have to operate in the range of negative voltages (in respect of earth), in embodiments of the invention the arrangement is made in such a way that, in addition to the positive supply voltage for operation mentioned, a negative supply voltage (in the example larger than the positive supply voltage) is to be supplied. The arrangement according to the embodiment example additionally has at least one circuit point which is to be connected to an earth potential, compared with which the positive supply voltage and negative supply voltage mentioned are measured. One advantage is that the output stage or power stage of the LVDS driver, which, compared with other components of the circuit, has to provide a relatively high current to feed a relatively low impedance consumer, namely a receiver for the output signals of the LVDS driver, owing to the small supply voltage has only a low power consumption. By contrast, the other components of the circuit operate in the embodiment example with considerably smaller currents, so a higher operational voltage there does not lead to an undesired increase in the overall power of the LVDS driver.

In the embodiment of the invention according to claim 4 it is of advantage that the changes in the amplification factor of the multiplier can be performed easily and with low power and the circuit driving it is hardly loaded. In the multiplier, which in the embodiment example is constructed in a known way from six transistors, the basic connections (or more generally) control connections of two of the six transistors are applied to a controllable voltage and the basic connections of two other transistors are applied to a fixed voltage. In this way the amplification factor and thus the multiplication factor can be changed. The input signals to be amplified are in the embodiment example supplied to the emitters of the transistors mentioned and the output signal, which in the embodiment example is supplied to an output stage, appears on the collectors.

In one embodiment of the invention it is provided that the current source is provided for changing the offset of the output voltage of the LVDS driver. In the embodiment example here too the drive takes place via a MOSFET, which drives a further transistor controlling the current of the current source. This MOSFET is embodied in the example in a complementary technology for comparing said MOSFET for automatic control of amplification.

BRIEF DESCRIPTION OF THE DRAWINGS

Further features and advantages of the invention emerge from the following description of an embodiment example of the invention using the drawings, which show details essential to the invention, and from the claims. The individual features can be realised in an embodiment of the invention each individually on its own or several together in any combination.

CIRCUIT PRINCIPLE

Figure 1:
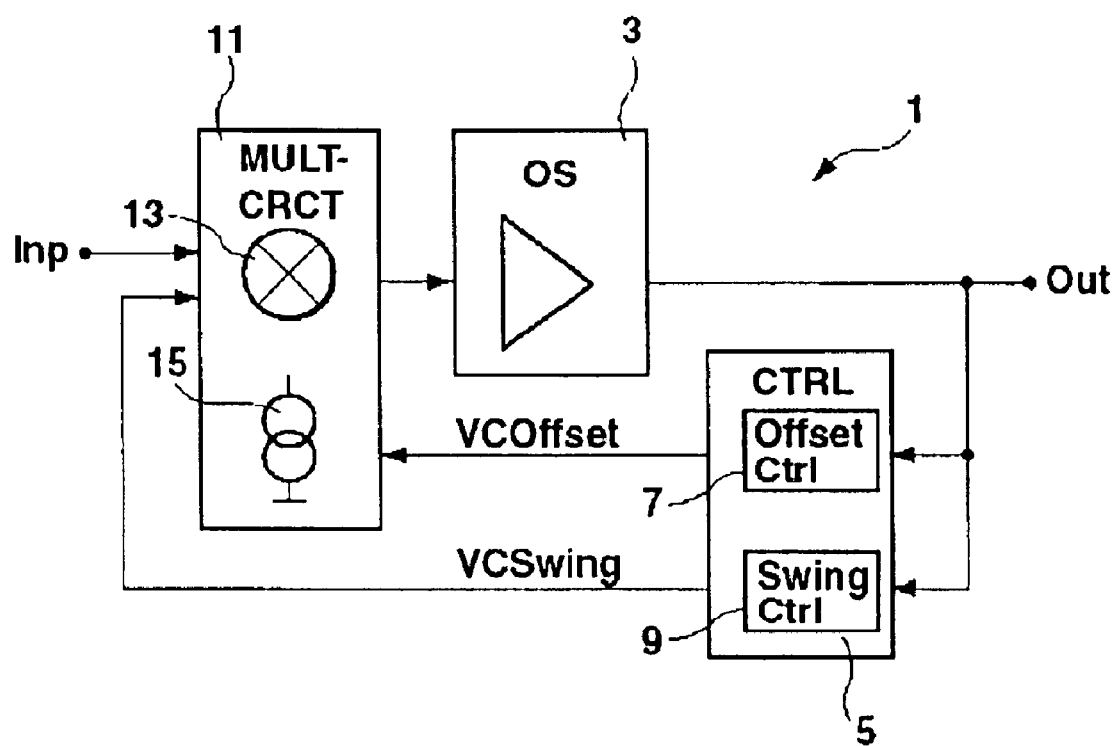
FIG. 1 shows a block diagram of an LVDS driver.

In FIG. 1 an LVDS driver 1 has an output stage 3, an automatic control block 5 with two automatic control circuits, namely an offset automatic control (Offset Ctrl) 7 and a differential voltage automatic control (Swing Ctrl) 9 and a multiplier circuit 11, which has a multiplier 13 and a controllable current source 15.

The differential output signal Out, which is applied in operation to outputs Out+ and Out− of the LVDS driver 1 (see also FIG. 2), is supplied to the automatic control block 5. In the automatic control circuit OffsetCtrl 7 the direct current offset of the output signal is compared with the specified offset reference value and from this the value of a control voltage VCOffset is generated. In automatic control circuit SwingCtrl 9 the dynamic drive of the output signal is compared with the specified differential voltage reference value and from this the value of a control voltage VCSwing is generated. The current source 15 is controlled in the multiplier circuit 11 with the control voltage VCOffset and therefore in output stage 3 the offset of the output signal Out is tracked. The amplification coefficient of the differential input signal Inp is controlled in the multiplier circuit 11 with the control voltage VCSwing and therefore in output stage 3 the differential voltage of the output signal Out is tracked. In output stage 3 power amplification of the output signal of the multiplier circuit 11 is carried out.

Figure 2:
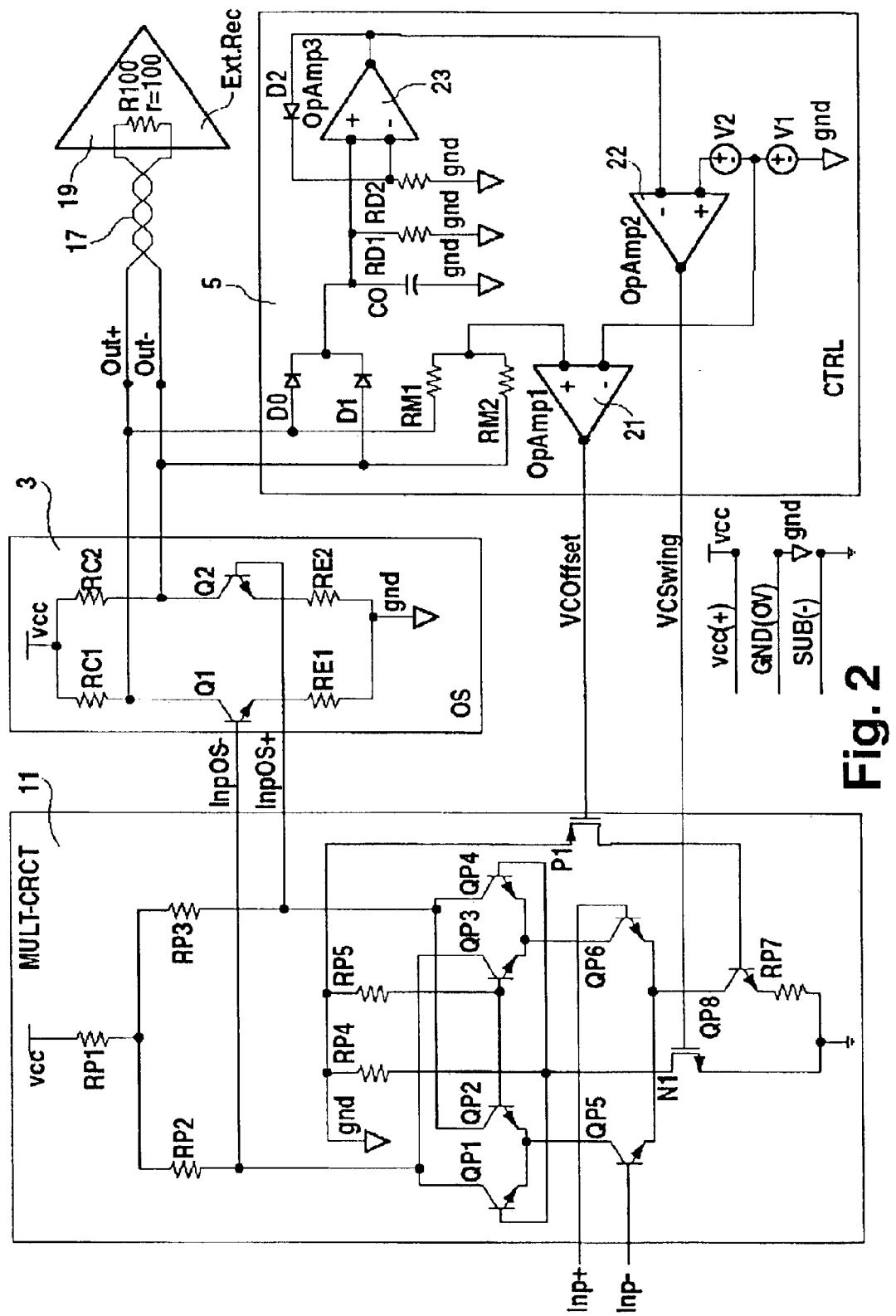
FIG. 2 shows the circuit of the arrangement according to FIG. 1.

As FIG. 2 shows, to outputs Out+ and Out− a symmetrical line 17, illustrated as a twisted two-wire line, is also connected, which is connected to an external LVDS receiver (ExtRec) 19 with an input resistance of, in the example, 100 ohms, for which the differential output signal is determined.

Explanation of the Function Blocks

The arrangement according to FIG. 2 contains semiconductor elements (including several npn transistors) in bipolar techniques as well as several MOSFETs, in other words the arrangement is embodied in bipolar and MOS technology.

FIG. 2 contains complementary MOSFETs, so this is a case of an arrangement in BICMOS technology.

The automatic control block 5 (CTRL) in FIG. 2 consists of an offset voltage measuring circuit, an offset voltage comparison circuit, a differential voltage measuring circuit and a differential voltage comparison circuit. It has a first operational amplifier 21 (OpAmp 1), a second operational amplifier 22 (OpAmp2) and a third operational amplifier 23 (OpAmp3). The offset voltage measuring circuit consists of resistors RM1 and RM2, the serial circuit of which is connected in each case to a connection of the differential output (Out+ and Out−) of the LVDS driver circuit. On the common node of resistors RM1 and RM2 there arises a voltage corresponding to the offset voltage of the differential LVDS output signal if both resistors are chosen as of equal size, as is the case in the example. The two resistors should as far as possible be chosen as large enough to influence the output impedance of the LVDS driver circuit only minimally; this is the case in the example.

The common node of resistors RM1 and RM2 is connected to the offset voltage comparison circuit, consisting of operational amplifier 21 (OpAmp1), in particular to the positive input of operational amplifier OpAmp1. The negative input of the operational amplifier is connected to an offset reference voltage source V1, corresponding to the specified offset reference value for LVDS driver circuits and therefore should be very largely independent of changes in temperature, operational voltage and technology; in the example V1 is a band gap preference voltage source. The automatic control voltage VCOffset is generated at the output of OpAmp1. The counter coupling path of OpAmp1 runs via the drive of the current source of the multiplier circuit 11 to the output of the multiplier circuit 11 and via the LVDS output stage (OS) 3 and the offset voltage measuring circuit to the positive input of OpAmp1. In the adjusted state the voltage at the positive input of OpAmp1 is equal to the voltage at the negative input, apart from a minimal offset error of the operational amplifier itself.

The differential voltage measuring circuit consists of a rectifier circuit with diodes D0 and D1, resistor RD1 and capacitor C0, as well as a special voltage deduction circuit with the third operational amplifier OpAmp3, diode D2 and resistor RD2. The anodes of diodes D0 and D1 are connected in each case to the differential output (Out+ and Out−) of the LVDS driver circuit. The cathodes of these two diodes are connected to one another, to resistor RD1, the capacitor C0 and the positive input of operational amplifier OpAmp3, wherein RD1 and C0 are connected parallel and form a voltage integration circuit. Operational amplifier OpAmp3 is connected at its output to the anode of diode D2, whose cathode is connected to the negative input of OpAmp3 and resistor RD2. If now, e.g. the anode potential of diode D0 is higher at node Out+ than that of diode D1 at node Out−, owing to the positive half-wave of the LVDS output signal, the cathode potential of both diodes follows that of diode D0. During the negative half-wave of the LVDS output signal at node Out+ the positive half-wave is located at node Out− and therefore at the anode of diode D1, so the cathode potential of both diodes follows that of diode D1. This potential is in time integrated with the aid of resistor RD1 and the capacitor C0 and is thus applied to the positive input of operational amplifier OpAmp3 as a pulsating direct current.

Operational amplifier OpAmp3 operates as a voltage deducer, wherein the output potential is one diode voltage above its input potential. This diode voltage compensates the temperature course of diodes D0 and D1. Provided that both diodes D0, D1 and D2 and resistors RD1 and RD2 are of equal size and of the same type, approximately half the differential voltage of the LVDS output signal is received at the output of the operational amplifier. The output of operational amplifier OpAmp3 is connected to the differential voltage comparison circuit, consisting of operational amplifier OpAmp2, in particular to the negative input of operational amplifier OpAmp2. The positive input of the operational amplifier is connected to an amplitude reference voltage source V2, which corresponds to the specified offset reference voltage plus half the specified output amplitude reference value for LVDS driver circuits and therefore should be very largely independent of changes in temperature, operational voltage and technology; V2 is therefore embodied as a band gap reference voltage source. The automatic control voltage VCSwing is generated at the output of OpAmp2.

The counter coupling path of OpAmp2 runs via the drive of a control input of the multiplier circuit 11 to the output of the multiplier circuit 11 and via LVDS output stage 3 and the differential voltage measuring circuit to the negative input of OpAmp2. In the adjusted state the voltage at the negative input of OpAmp2 is equal to the voltage at the positive input, apart from a minimal offset error of the operational amplifier itself.

The controlled system of the circuit arrangement illustrated in FIG. 2 contains an automatically controllable amplifier stage and a single output stage 3. The output stage 3 represents with transistors Q1/Q2, resistors RC1/RC2 and RE1/RE2 two collector stages. (The letter "C" in the resistor designations "RC" is not in any way a reference to a capacitor).

The automatically controllable amplifier stage consists of a four-quadrant mutual conductance multiplier (Gilbert cell), formed substantially by six transistors QP1 to QP6, and the controllable current source 15, which is substantially formed by a transistor QP8 and a resistor RP7.

The differential data input signal is applied to nodes Inp+ or Inp− of the two lower transistors QP5 or QP6 of the four-quadrant mutual conductance multiplier. Transistors QP5 and QP6 form a differential amplifier. The collectors of these transistors function as outputs of two current sources which operate 180 degrees phase-offset to one another owing to the differential data input signal.

The overall current of the automatically controllable amplifier is provided by the automatically controllable current source 15. This consists of transistor QP8, the emitter of which is counter-coupled via resistor RP7. The basic potential at QP8 is provided via transistor P1, the input of which is controlled by the automatic control voltage VCOffset.

Transistors QP1, QP2, QP3 and QP4 are the actual actuators of the automatically controllable amplifier. The inputs of QP1/QP4 or QP2/QP3 are combined and act as control inputs of the automatically controllable amplifier. The collectors of QP2/QP4 are connected to collector resistor RP3 and the collectors of QP1/QP3 are connected to collector resistor RP2. The collectors connected to resistors RP2 and RP3 form the outputs of the multiplier circuit and deliver opposite-phase signals (counter clock signal or differential signal) at a level greater than zero volts to the inputs of output stage 3. RP1 serves to reduce the voltage, in order to prevent saturation of the collectors of transistors Q1 and Q2 in output stage 3, and improves the dynamic behaviour of output stage 3.

The control input on transistor pair QP2/QP3 has a fixed potential via resistor RP5. The potential at the control input of transistor pair QP1/QP4 is provided by a changeable voltage distributor, consisting of resistor RP4 and transistor N1. The distribution ratio of the voltage distributor is determined by the automatic control voltage VCSwing.

Explanation of Function
Automatic Control of Offset Voltage

Assuming the offset voltage at the LVDS driver output becomes more positive than it was specified owing to external influencing factors (e.g. changes in temperature and/or operational voltage), this change in voltage is conducted via the common node of resistors RM1 and RM2 to the positive input of OpAmp1. Here a positive voltage difference arises, compared to the offset reference voltage. This voltage difference leads to a positive change in the automatic control voltage VCOffset at the output of OpAmp1. Thereupon the PMOS transistor P1 in the multiplier becomes more highly resistive, owing to its slightly smaller gate source voltage, leading to a lower basic current for the NPN transistor QP8, which in turn results in a lower collector current in QP8. Because of the reduction in the overall current in the multiplier through transistor QP8 the offset voltage increases at resistors RP2 and RP3 and therefore at the input of LVDS output stage 3 with nodes InpOS+ and InpOS−. The increase in the basic potentials of transistors Q1 and Q2 and therefore the drop in voltage via transistors RE1 and RE2, which act as simple current source for output stage 3, leads to a higher current through resistors RE1/RE2 and RC1/RC2 in the output stage, thus reducing the offset voltage at nodes Out+ and Out−.

Automatic Control of Amplitude

If one assumes as an example an increase in the amplitude of the differential LVDS output signal owing to external influencing factors, such as changes in temperature and/or operational voltage (a slight change in the LVDS line terminating impedance because of the exchange of the LVDS receiving circuit is also conceivable), this change in amplitude will lead via diodes D0 and D1 to an increase in the potential at the positive input of operational amplifier OpAmp3. Via diode D2, at the output of OpAmp3 and therefore at the negative input of operational amplifier OpAmp2 a potential is thereupon received corresponding to half the increased amplitude of the differential LVDS output signal. At the negative input of OpAmp2 a positive voltage difference arises, compared to the amplitude reference voltage. This difference in voltage leads to a negative change in the automatic control voltage VCSwing at the output of OpAmp2. The lower voltage VCSwing at the gate of the NMOS transistor (N channel MOSFETs) N1 in the multiplier thereupon causes a higher internal resistance of the transistor and as a result of this a higher drain source voltage Vds of N1.

The current flow through these transistors is determined by the value of the automatic control voltage at input QP1/QP4, compared to the fixed voltage at input QP2/QP3. Depending on the control voltage at input QP1/QP4 addition takes place of the 180 degree phase-offset currents through QP2 and QP4 or through QP1 and QP3. The voltage amplitude at RP2 and RP3 can thereby be changed. If the voltage at the two control inputs is equal, the sum of the partial currents is equal at any time and therefore the amplification is 0. If the two voltages at the control inputs are unequal, the amplification is unequal to 0.

The voltage at control input QP1/QP4 must therein never become smaller than the voltage at control input QP3/QP4, as otherwise phase rotation of the data signal results. This is prevented by suitable dimensioning.

Because of the slightly increased potential at input QP1/QP4, compared to the fixed voltage at input QP2/QP3, the differential voltage at this input of the multiplier and therefore the multiplication factor is reduced, leading to a reduction in the voltage amplitude at resistors RP2 and RP3 and consequently also to reduction in the amplitude at the output of the LVDS driver circuit, as this has a permanently set amplification. The entire circuit is fed by a positive supply voltage VCC and a negative supply voltage SUB, to which the substrate of the integrated semi-conductor circuit is applied. Additionally, an earth potential GND, located between these two supply voltages, is applied to several points of the circuit.

In the circuit according to the invention the majority of the absorbed overall current of the circuit (approx. 10 mA of 12 mA) flows in output stage 3 (bipolar technology only). In order to reduce the power loss, the output stage is operated only at the low positive operational voltage VCC of 1.8 volts, which is only minimally higher than the specified output voltage of 1.2 volts. The negative operational voltage SUB is 3.2 volts. Therefore the entire operational voltage of the multiplier circuit is 5 volts. The operational amplifiers are fed with −3.2 volts. From this emerges a typical power loss of approximately 30 mW (1.8V*10 mA+5V*2mA) of the entire circuit according to FIG. 1 and FIG. 2. Overall, important advantages are: high data bit rate of approximately up to 1 Gbit/s, small power consumption; small positive supply voltage for the arrangement, in particular for the output stage; integration on a single chip. Logical circuits, the output signal of which is supplied to inputs Inp+ and Inp−, can therein be additionally accommodated on the chip. The output signals of logical circuits of this kind are often at a level below zero volts. The circuit according to FIG. 2 can process these signals as input signals (owing to the negative operational voltage SUB) and deliver an output signal, which is, as specified for LVDS, in general at a level above zero volts.

If the automatic control block 5 is removed from the arrangement according to FIG. 1, a circuit arrangement remains, which carries out only a level adjustment and an adjustment in so far as a relatively low impedance consumer (the receiver to be connected to the output stage) has to be fed. This circuit arrangement therefore, as it were, buffers the input voltage against loading by the receiver and is therefore designated by the word buffer.

Figure 3:
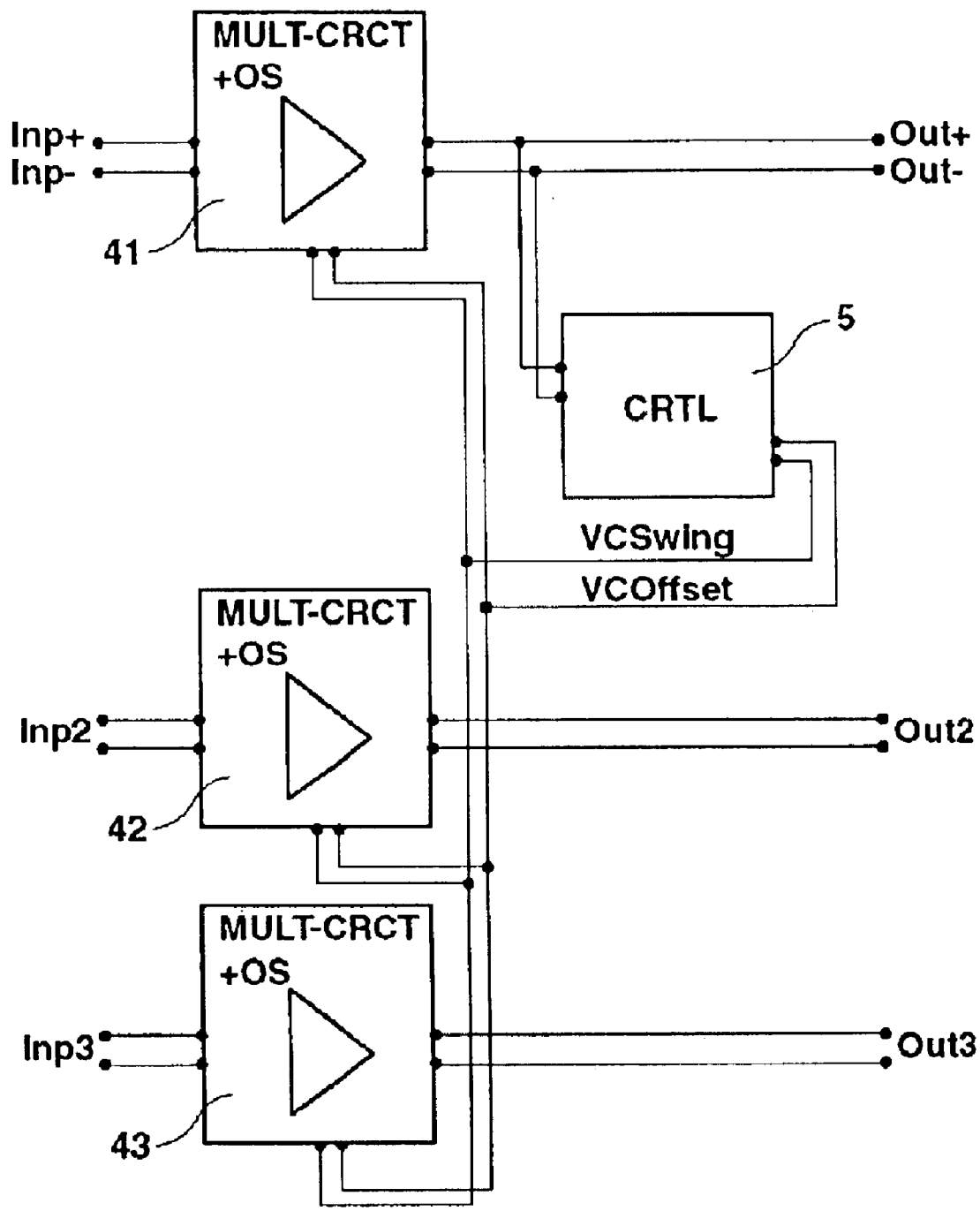
FIG. 3 shows a block diagram of a different arrangement, in which there are several output stages, of which, as in FIG. 2, the output signal of a single output stage is automatically controlled by the single present automatic control block, but the output signals of further output stages are controlled in open-loop control by the automatic control block.

According to FIG. 3 the proportional power loss of the automatic control block 5 can be reduced per LVDS buffer in that, additionally to the buffer shown in FIG. 2, which is designated in FIG. 3 by the reference numeral 41, further LVDS buffers 42 and 43 of automatic control circuit 5 of the first buffer 41 are controlled at the same time (not automatically controlled). This connection of further buffers is possible without changes, because the automatic control inputs VCSwing and VCOffset are held on gates of MOSFETs and no input current flows through them. In the example the further buffers 42 and 43 are also contained in an integrated circuit containing an arrangement according to FIG. 2. They can instead be arranged separately.

An arrangement of this kind can be introduced without problem, in particular if all the receivers to be fed behave very similarly, in particular are of identical structure, and if, with a temperature dependency of the receivers which has to be taken into account, these receivers are all approximately at the same temperature as the receiver which is connected to the automatically controlled buffer. These conditions generally exist if the various receivers are located within the same device, preferably on the same circuit card or board. There should therein be maximum mutual distances of approximately 30 cm, for example.

To further increase the automatic control amplification and therefore the accuracy of automatic control, in another embodiment the output stage is carried out as a current counter-coupled differential stage, in that the emitters of transistors Q1 and Q2 are connected.

A further reduction in power loss is achieved if the default value of the amplitude reference value is reduced to such an extent that the specified amplitude value of 250 mV is still maintained under all technological and environmental conditions. This is supported in particular by the present automatic control.

The arrangement according to FIG. 2 is embodied in BICMOS technology as an integrated circuit. There are namely bipolar transistors as well as at least one N channel MOSFET (transistor N1) and at least one P channel MOSFET (transistor P1). Instead of this two MOSFETS with equal polarity (two with N channel or two with P channel) could be provided for the MOSFETS present there. In the latter case the specific circuit generally has to be modified, for example the MOSFET which is now to be provided in a different polarity has to be moved to a different place in the flow path it controls. In comparison to the arrangement according to FIG. 2 it can also be necessary to reverse the polarity of one of the control signals coming from the automatic control block. In the case of MOSFETs with equal polarity the circuit is one in combined bipolar and MOSFET technology. This modified circuit arrangement also has the advantage of low power consumption owing to the use of MOSFETs, so this arrangement is also in principle suitable for a parallel circuit of buffers, analogously to FIG. 3.

All transistors mentioned, with the exception of the MOSFETs (N1, P1), are embodied in bipolar techniques.

What is claimed is:

1. Circuit arrangement for a Low Voltage Differential Signal (LVDS) driver, which uses combined bipolar and MOSFET technology with at least two MOSFETs, wherein a multiplier circuit is connected to an output stage of the LVDS driver and the multiplier circuit is controlled by means of an automatic control circuit, which generates control signals for controlling a current source of the multiplier circuit and for controlling the amplification factor of differential input signals of the multiplier circuit.

2. Circuit arrangement according to claim 1, wherein the output stage is constructed with an aid of a first operational voltage from a first voltage supply and wherein, at least one further component of the LVDS circuit is constructed with aid of a second operational voltage from a second voltage supply, wherein when said first operational voltage is positive, said second operational voltage is negative and visa versa, said first operational voltage and said second operational voltage are measured with respect to an earth potential.

3. Circuit arrangement according to claim 2, wherein the multiplier circuit is constructed simultaneously by the first and the second operational voltage.

4. Circuit arrangement according to claim 1, characterized in that the control signal outputs of the automatic control circuit are coupled to one input each of a MOSFET, wherein one of said MOSFETs is constructed for controlling the current source and the other MOSFET for controlling the amplification factor of the multiplier.

5. Circuit arrangement according to claim 1, characterized in that the current source is provided for changing the offset of the output voltage of the LVDS driver.

6. Circuit arrangement according to claim 1, characterized in that the multiplier circuit is constructed for delivering to the output stage two opposite-phase signals to be amplified.

7. Circuit arrangement according to claim 6, characterized in that the output stage contains bipolar transistors, which are constructed in each case for amplifying one of the output signals of the multiplier.

8. Circuit arrangement according to claim 1, characterized in that the automatic control circuit is constructed as a device for detecting a control signal dependent on the difference in voltage between differential signals delivered by the output stage and a device for generating a control signal dependent on the offset of the output signals of the output stage.

* * * * *